(12) United States Patent
Coumou

(10) Patent No.: US 6,522,121 B2
(45) Date of Patent: Feb. 18, 2003

(54) BROADBAND DESIGN OF A PROBE ANALYSIS SYSTEM

(75) Inventor: David J. Coumou, Webster, NY (US)

(73) Assignee: ENI Technology, Inc., Rochester, NY (US)

(*) Notice: Subject to any disclaimer, the term of this patent is extended or adjusted under 35 U.S.C. 154(b) by 0 days.

(21) Appl. No.: 09/811,507

(22) Filed: Mar. 20, 2001

(65) Prior Publication Data

US 2002/0135378 A1 Sep. 26, 2002

(51) Int. Cl.[7] ............................................. G01R 23/00
(52) U.S. Cl. ............................... 324/76.19; 315/111.21
(58) Field of Search ........................ 324/464, 622–647, 324/709, 76.11–76.19; 315/111.21; 216/61–70; 438/8–10, 17; 235/462; 341/61

(56) References Cited

U.S. PATENT DOCUMENTS

| 5,536,928 A | 7/1996 | Seigel .......................... 235/462 |
| 5,565,737 A | 10/1996 | Keane .................... 315/111.21 |
| 5,770,992 A | 6/1998 | Gerrish et al. ........... 315/111.21 |
| 6,061,006 A | 5/2000 | Hopkins ....................... 341/61 |

Primary Examiner—N. Le
Assistant Examiner—Amy He
(74) Attorney, Agent, or Firm—Harness, Dickey & Pierce, P.L.C.

(57) ABSTRACT

A radio frequency (RF) probe analysis system has a broadband design. The analysis system includes a sampling unit for generating digital power signals based on a plurality of analog signals. The analog signals characterize power delivered from an RF power delivery system to a plasma chamber. The analysis system further includes a digital processing unit for generating a digital spectrum signal based on the digital power signals. The sampling unit simultaneously samples a first plurality of frequencies from the analog signals such the that digital spectrum signal defines signal levels for the first plurality of frequencies. The sampling unit may also simultaneously sample a second plurality of frequencies from the analog signals such that the digital spectrum signal further defines signal levels for the second plurality of frequencies. The broadband architecture of the sampling unit enables closed loop control of power delivered to the chamber to tolerances unachievable through conventional approaches.

27 Claims, 7 Drawing Sheets

-PRIOR ART-

BROADBAND DESIGN OF A PROBE ANALYSIS SYSTEM

TECHNICAL FIELD

The present invention generally relates to semiconductor plasma etching. More particularly, the invention relates to a radio frequency (RF) probe analysis system having a broadband design.

BACKGROUND

In the semiconductor industry, plasma etching has become an integral part of the manufacture of semiconductor circuits. In fact, etchers are frequently used in semiconductor processing when a relatively straight vertical edge is needed. For instance, when etching the polysilicon gate of a MOS transistor, undercutting the polysilicon can adversely affect the operation of the transistor. Undercutting is frequently encountered when a liquid etching method is used. As a result, other etching techniques such as plasma etching have evolved. Plasma etching, which uses ions accelerated by an electric field, tends to etch only horizontal exposed surfaces and therefore avoids undercutting.

In order to effectively execute a plasma etching process (as well as any other plasma process), it has been determined that a system for controlling the power delivered to the plasma chamber highly desirable. In fact, as the complexity of etching processes increases, strict requirements to control the power to accuracies as high as plus or minus one percent have evolved. Thus, in addition to the power delivery system, a closed loop control system is typically employed to monitor the amount of power actually being delivered to the chamber.

FIG. 7 therefore shows a conventional configuration wherein a power delivery system 11 supplies a plasma chamber 13 with RF power for the purpose of executing a plasma process such as etching. Generally, a closed loop control system 15 monitors the RF power, and provides various control signals to the power delivery system 11.

Conventional approaches to the control system 15 have been unable to meet the increasingly strict tolerance requirements of modern day plasma processes for a number of reasons. One particular reason is that the RF power typically has multiple fundamental frequencies as well as corresponding harmonic tones. For example, the voltage applied to the chamber 13 may have fundamental frequencies at both 2 MHz and 27 MHz. The same is true for the current. The 2 MHz signal will have harmonics at 4 MHz, 6 MHz, 8 MHz, etc. The 27 MHz signal will have intermodulation products at 25 MHz, 23 MHz, etc. This is significant because knowledge of the amount of energy present at all of these frequencies is needed for tighter control over the power delivered to the chamber 13. For example, a digital spectrum signal representing the amount of instantaneous power at each of these frequencies would enable the power delivery system 11 to adjust various internal parameters on a frequency-specific basis. Other useful signals include digital magnitude and digital phase signals.

The conventional closed loop control system 15, however, has a sampling unit that treats each frequency of interest individually by mixing the particular signal with an intermodulation signal (such as a signal 10 kHz greater than the frequency of the signal of interest). The mixing results in a second order intermodulation product at 10 kHz, and this product is sampled using an audio grade digitizer. Thus, the result is a plurality of digital power signals (generated by a plurality of digitizers), where each digital power signal corresponds to a mixed frequency signal. It is easy to understand that in the above example, wherein a number of fundamental frequencies as well as harmonic frequencies are present, the sampling unit can become quite complex and expensive. Furthermore, the desire to simultaneously track harmonics cannot be fully satisfied under this approach.

Another difficulty associated with the conventional control system 15 relates to the fact that frequency tuning (to improve impedance matching) is becoming more popular in the semiconductor industry. Thus, prior knowledge of even the fundamental frequencies is often difficult to predetermine. Furthermore, it is envisioned that pulsing power to the chamber will become more prevalent, thereby requiring a response time for the sampling circuit that is unachievable under the conventional approach.

It is important to note that after the RF signals have been digitized into the digital power signals, a fast fourier transform (FFT) is typically performed on a complex composite signal formed from the sampled voltage signal and the sampled current signal for each individual frequency. Once again, the processing overhead associated with such an approach is quite high due to the individual treatment of frequencies. Furthermore, the conventional approach typically employs analog circuitry, which inherently can possess filters with non-linear phase response, and lacks resiliency to tolerances aging and drift. With specific regard to channel-to-channel matching, it has been experienced that the conventional design does not provide a system that is resilient to tolerances, aging, drift or calibration.

The above and other objectives are provided by a radio frequency (RF) probe analysis system in accordance with the present invention. The probe analysis system (operating in either a broadband spectral analysis mode or a broadband digital mixing mode) includes a sampling unit for generating digital power signals based on a plurality of analog signals. The analog signals characterize power delivered from a RF power delivery system to a plasma chamber. The probe analysis system further includes a digital processing unit for generating a digital spectrum signal based on the digital power signals. The sampling unit simultaneously samples a first plurality of frequencies (i.e., bandwidth) from the analog signals such that the digital spectrum signal defines signal levels for the first plurality of frequencies. The sampling unit therefore has a broadband architecture and ameliorates the tolerances of conventional approaches for closed loop control of power delivered to plasma chambers.

Further in accordance with the present invention, a sampling unit for an RF probe analysis system is provided. The sampling unit has a first filtering module and a primary analog-to-digital (A/D) converter. The first filtering module band limits an analog voltage signal and an analog current signal to a first predetermined bandwidth. The analog voltage signal and the analog current signal have a first plurality of frequencies, where the first predetermined bandwidth includes the first plurality of frequencies. The primary A/D converter is coupled to the filtering module and generates a first digital voltage signal based on the analog voltage signal. The primary A/D converter also generates a first digital current signal based on the analog current signal. The primary A/D converter has a dual channel capability such that the first digital voltage signal and the first digital current signal are synchronized.

In another aspect of the invention, a method for analyzing RF power delivered to a plasma chamber is provided. A first plurality of frequencies is simultaneously sampled from a plurality of analog signals. The analog signals characterize the RF power delivered to the chamber. The method further provides for generating digital power signals based on the analog signals, and generating a digital mixing signal having a predetermined mixing frequency. The digital power signals are down converted based on the digital mixing signals such that the first plurality of frequencies are reduced in accordance with the predetermined mixing frequency. The method further provides for reducing a data quantity of the digital power signals, and band limiting the digital power signals based on a fundamental frequency of the first plurality of frequencies. In phase (I) and quadrature (Q) signals are generated based on the digital power signals and a desired sampling rate. The method further provides for generating digital magnitude signals and digital phase signals based on the I and Q signals. Digital spectrum signals are then generated based on the digital phase signals. The digital spectrum signals therefore define signal levels for the first plurality of frequencies.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute part of this specification. The drawings illustrate various features and embodiments of the invention, and together with the description serve to explain the principles and operation of the invention.

BRIEF DESCRIPTION OF THE DRAWINGS

The various advantages of the present invention will become apparent to one skilled in the art by reading the following specification and sub-joined claims and by referencing the following drawings, in which:

FIG. 6 is a plot showing the tracking of frequencies to a more finite accuracy in accordance with the-principles of the present invention.

DETAILED DESCRIPTION OF THE PREFERRED EMBODIMENTS

Figure 1:
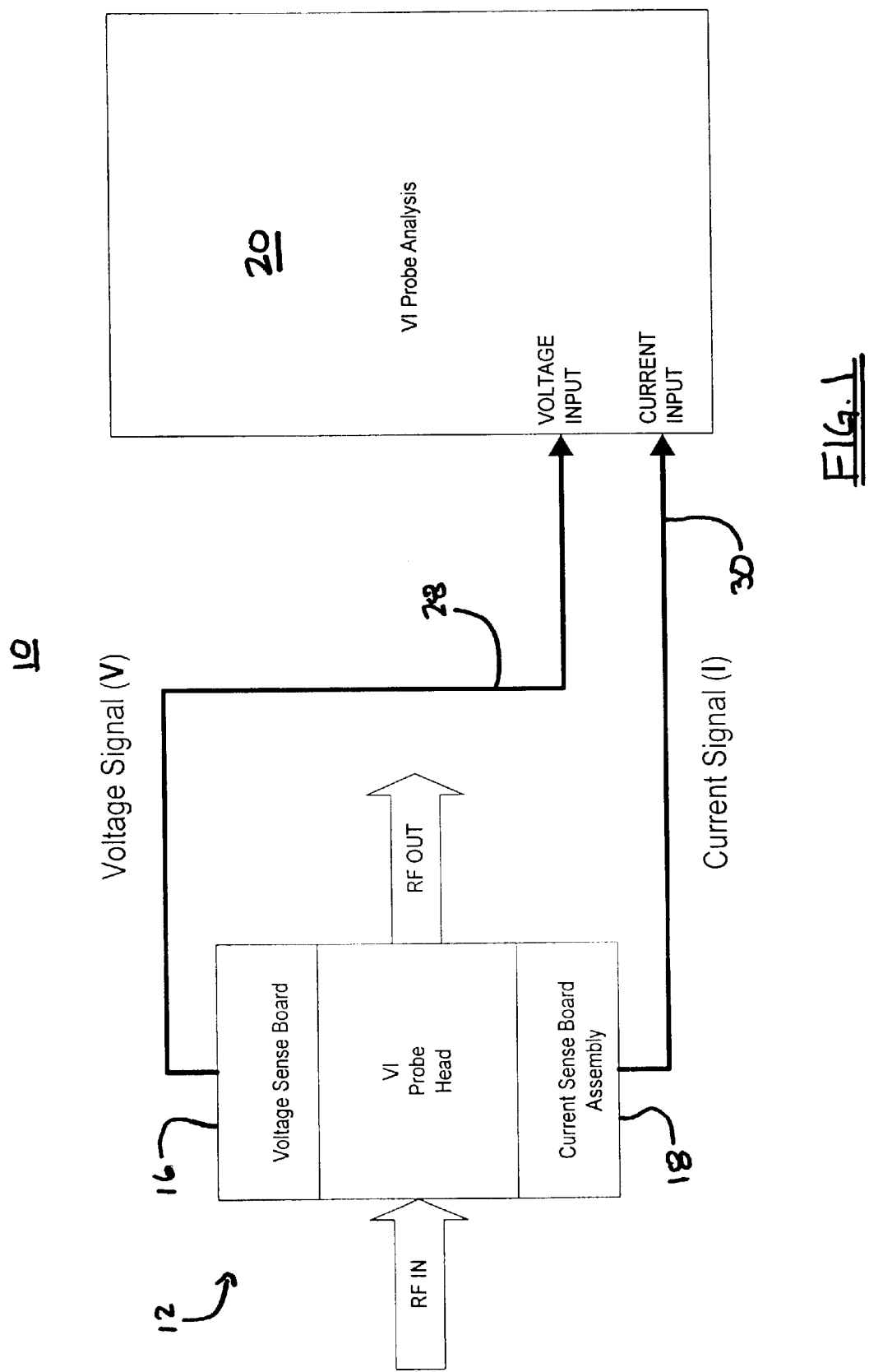
FIG. 1 is a block diagram showing a closed loop control system in accordance with the principles of the present invention.

As shown in FIG. 1, a closed loop control system 10 has a probe head 12 and a probe analysis system 20. Generally, the probe head 12 generates an analog voltage signal 28 and an analog current signal 30 based on the radio frequency (RF) power supplied to the plasma chamber (not shown) by the power delivery system (not shown). While many approaches have been suggested for the probe head 12, one solution involves the use of a voltage sensing board 16 to monitor the RF voltage, and a current sensing board 18 to monitor the RF current. The probe analysis system 20 generates digital spectrum signals, digital magnitude signals and digital phase signals, as needed by the power delivery system for closed loop control. It is important to note that the selection of the digital signals to be generated by the analysis system 20 is dependent upon the application. Thus, any combination of these signals can be generated without parting from the spirit and scope of the invention.

Figure 2:
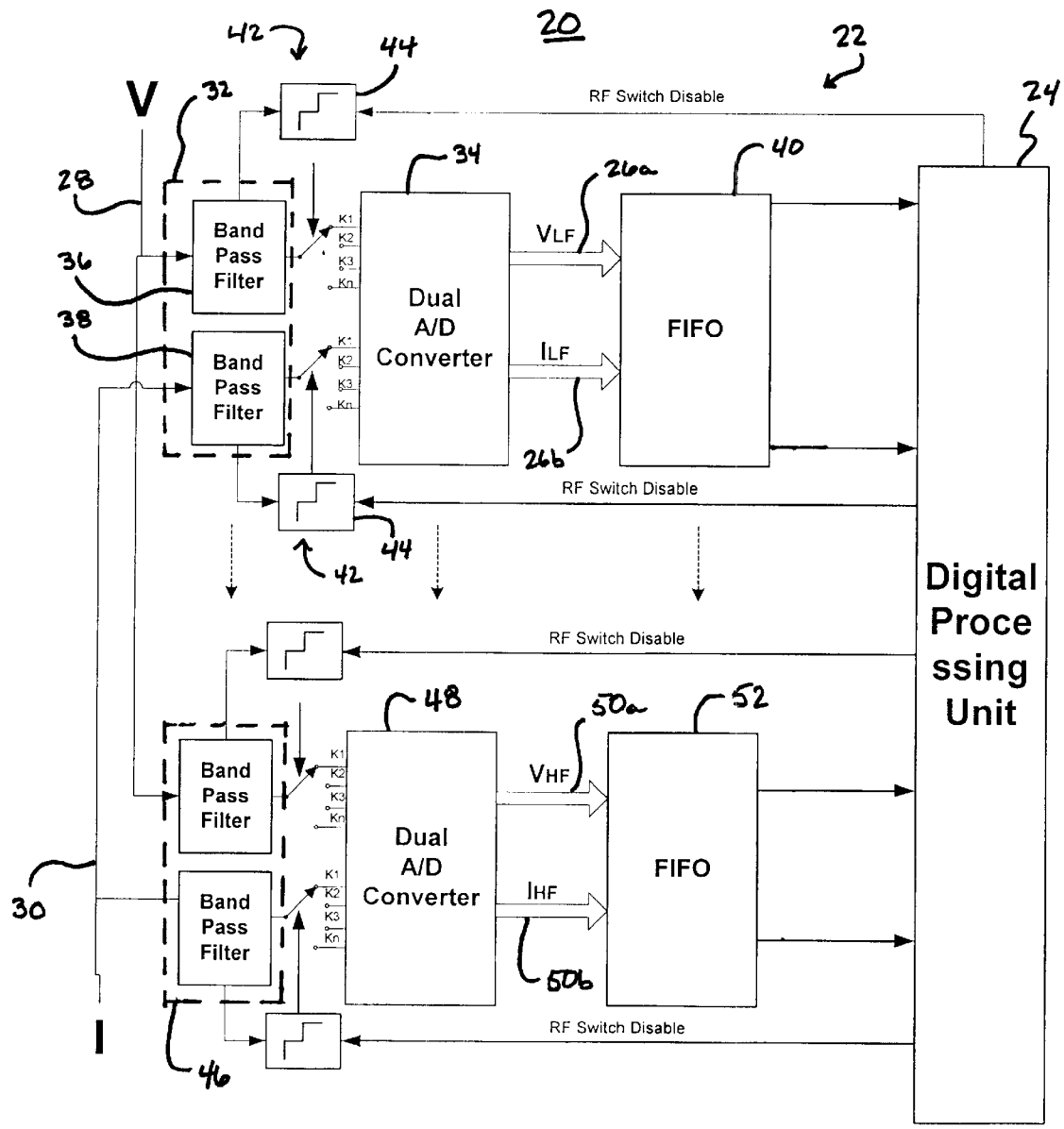
FIG. 2 is a block diagram showing a broadband sampling unit in accordance with the principles, of present invention.
Figure 3:
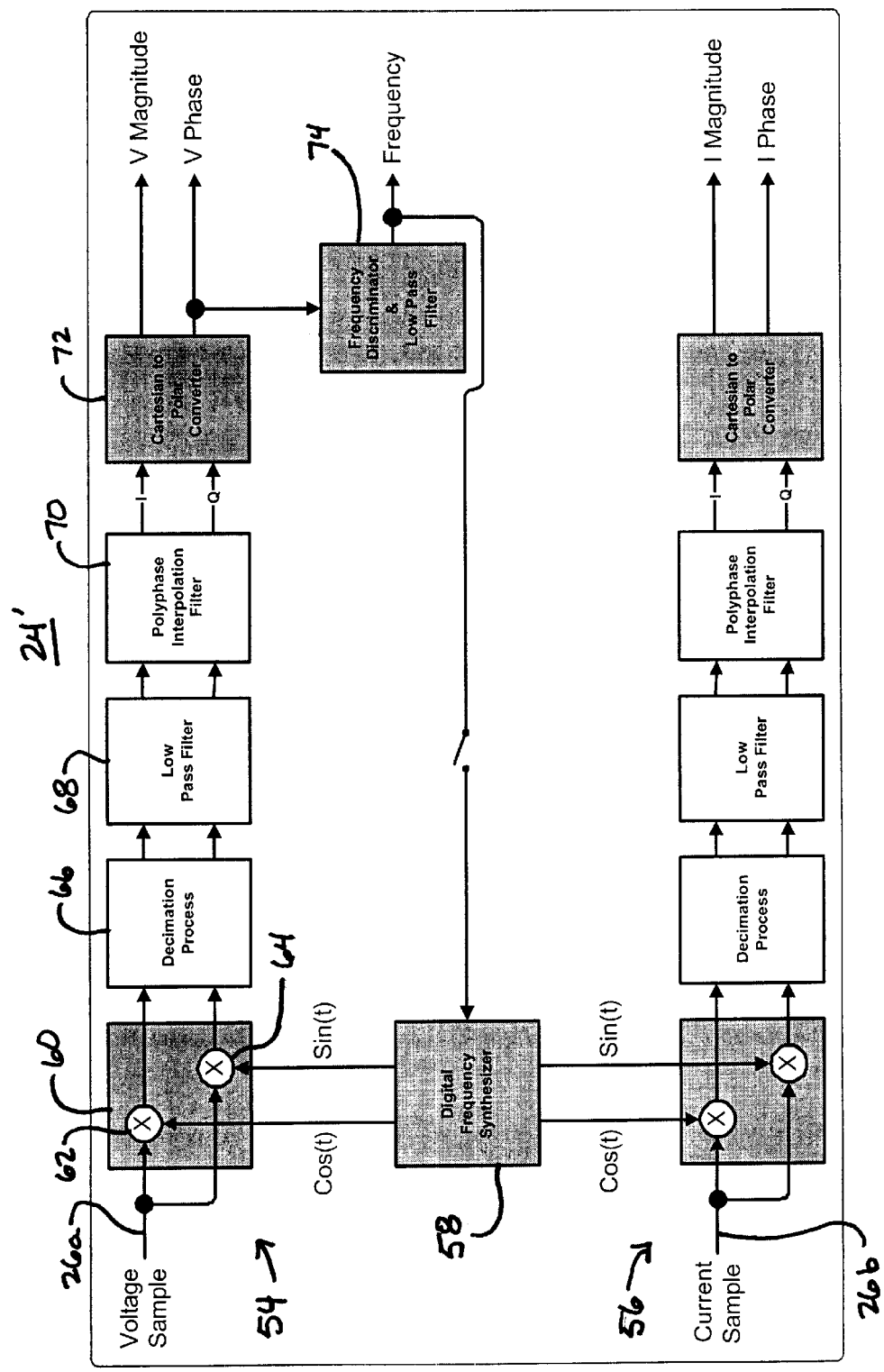
FIG. 3 is a block diagram showing a baseband digital processing unit in accordance with the principles of the present invention.

Turning now to FIG. 2, the probe analysis system 20 is shown in greater detail. While the present invention will be primarily described with respect to a plasma etching process, it is important to note that the present invention is not so limited. In fact, any application in which it is desirable to simultaneously analyze multiple frequencies associated with analog signals can benefit from the present invention. Specific examples are therefore used for discussion purposes only. Notwithstanding, there are a number of particular benefits provided by the present invention for which plasma etching is uniquely suited.

Generally, it can be seen that the analysis system 20 has a broadband sampling unit 22 and a digital processing unit 24. The sampling unit 22 generates digital power signals 26 based on a plurality of analog signals 28,30. The analog signals 28,30 characterize power delivered from a RF power delivery system (not shown) to a plasma chamber (not shown). As will be described in greater detail below, the digital processing unit 24 generates a digital spectrum signal based on the digital power signals 26. Digital magnitude signals and digital phase signals may also be generated. The sampling unit 22 simultaneously samples a first plurality of frequencies from the analog signals 28,30 such that the digital spectrum signal defines signal levels for the first plurality of frequencies. Thus, by simultaneously sampling frequencies in a broadband architecture, significantly enhanced control over power delivery can be achieved.

Sampling Unit

Specifically, the analog signals 28,30 include an analog voltage signal 28 and an analog current signal 30. Preferably, the sampling unit 22 includes a first filtering module 32 for band limiting the analog voltage signal 28 and the analog current signal 30 to a first predetermined bandwidth. The first predetermined bandwidth includes the first plurality of frequencies. Thus, for example, the first predetermined bandwidth might include the fundamental frequency of 2 MHz and the harmonics of the fundamental frequency ranging up to 10 MHz. A primary analog-to-digital (A/D) converter 34 is coupled to the filtering module 32, wherein the primary A/D converter 34 generates a first digital voltage signal 26a ($V_{LF}$) based on the analog voltage signal 28. The primary A/D converter 34 also generates a first digital current signal 26b ($I_{LF}$) based on the analog current signal 30. The first digital voltage signal 26a and the first digital current signal 26b therefore define the digital power signals.

It is important to note that the primary A/D converter 34 has a dual channel capability such the first digital voltage signal 26a and the first digital current signal 26b are synchronized. As will be discussed in greater detail below, synchronization is critical to the broadband sampling scheme as well as to the overall operation of the system. For example, synchronization enables the comparison of resulting phase and magnitude outputs of the models. It should further be noted that although the illustrated primary A/D converter 34 is implemented in a single IC that contains two A/D converters, the present invention is not so limited. For example, cost savings can be obtained by using two separate A/D converters in separate IC packages. In such case, the A/D converters are closely coupled (synchronized sampling) to emulate a single IC package containing two A/D converters.

In this regard, it can be seen that a memory storage element such as first in first out (FIFO) 40 can be disposed between the primary A/D converter 34 and the digital processing unit 24 for temporarily storing the first digital voltage signal 26a and the first digital current signal 26b. Thus, if the sampling rate of the converter 34 exceeds the processing rate of the digital processing unit 24, then the converter data can be temporarily stored in order to pipeline the data. This is particularly useful for the baseband design of the digital processing unit 24 to be described below. The FIFO 40 is not necessary, however, if the sampling rate of the converter 34 does not exceed the hardware processing clock rate of the digital processing unit 24.

It is preferred that the filtering module 32 includes a first bandpass filter 36 for band limiting the analog voltage signal 28 and a second bandpass filter 38 for band limiting the analog current signal 30. Furthermore, the probe analysis system 20 may include a switching module 42 for selectively adjusting an attenuation of the analog signals 28,30 based on a signal level of the analog signals 28,30. Thus, a switch controller 44 and RF switches are located between the filtering module 32 and the converter 34 to select an attenuation path that is dependent on the magnitude of the analog signals. It can also be seen that a signal is provided to disable the switches from selecting an attenuation path if desired. Thus, the switch controller 44 selectively disables the switching module 42 based on a disable signal from the digital processing unit 24.

It will be appreciated that the sampling scheme can be further divided into multiple sampling sections. The above-described sampling scheme, indicated by the LF subscripts, is the basic paradigm of the architecture. Spectral folding, however, results when frequencies greater than ½ the sampling rate exist within the bandwidth of the signal. This is commonly referred to as undersampling or aliasing. The undersampled signal will appear within the digitized bandwidth of DC to ½ the sampling rate. Undersampling probe signals is an approach discussed in U.S. Pat. No. 5,565,737 to Keane, incorporated herein by reference. When the spectral folding of a fundamental frequency or a harmonic of one fundamental frequency coincides with the bandwidth of another fundamental frequency or harmonic(s) of the fundamental frequency, a second sampling model is necessary. The second sampling model is indicated by the HF subscripts.

Thus, the sampling unit 22 further simultaneously samples a second plurality of frequencies from the analog signals such that the digital spectrum signal further defines signal levels for the second plurality of-frequencies. The sampling unit 22 therefore also includes a second filtering module 46 and a secondary A/D converter 48. The second filtering module 46 band limits the analog voltage signal 28 and the analog current signal 30 to a second predetermined bandwidth, where the second predetermined bandwidth includes the second plurality of frequencies. It is important to note that the second predetermined bandwidth may or may not overlap with the first predetermined bandwidth, depending upon the application. The secondary A/D converter 48 generates a second digital voltage signal 50a based on the analog voltage signal 28 and generates a second digital current signal 50b based on the analog current signal 30. The second digital voltage signal 50a and the second digital current signal 50b therefore further define the digital power signals already defined by signals 26a and 26b. As already discussed, the secondary A/D converter 48 has a dual channel capability such that the second digital voltage signal 50a and the second digital current signal 50b are synchronized.

It can further be seen that the preferred probe analysis system 20 further includes a second memory device such as FIFO 52 disposed between the secondary A/D converter 48 and the digital processing unit 24 for temporarily storing the second digital voltage signal 50a and the second digital current signal 50b.

Thus, the second predetermined bandwidth might include the fundamental frequency of 27 MHz and the harmonics of the fundamental frequency ranging down to 22 MHz. As already noted, the frequency ranges may overlap depending upon the application.

Digital Processing Unit (Baseband)

Turning now to FIGS. 3–6, it will be appreciated that the present invention provides for either a baseband or broadband design of the digital processing unit. Specifically, FIG. 3 demonstrates a digital processing unit 24' having a first baseband processor 54 and a second baseband processor 56. The first baseband processor 54 processes the digital voltage signal 26a at the first plurality of frequencies. The second baseband processor 56 processes the digital current signal 26b at the first plurality of frequencies such that each baseband processor 54,56 has a corresponding digital power signal. It is important to note that a similar arrangement can be used to process signals at the second plurality of frequencies.

It can be seen that a digital frequency synthesizer 58 generates a digital mixing signal having a predetermined mixing frequency. The digital mixing signal has a cosine and a sine component (or functions) as shown. In the first baseband processor 54, a digital complex mixer 60 generally down converts the digital voltage signal 26a (i.e., the corresponding digital power signal) based on the digital mixing signal. Thus, the center frequency of the first plurality of frequencies is reduced in accordance with the predetermined mixing frequency. It will be appreciated that the digital complex mixer 60 multiplies in the time domain to create both sum and difference terms in the frequency domain. To perform this function, the complex mixer 60 includes two digital multipliers 62,64. Both multipliers 62,64 receive data from the sampling unit. The first multiplier 64 receives the sine component of the digital mixing signal from the synthesizer 58, while the second multiplier 62 receives the cosine component.

The outputs from the multipliers 62,64 represent a digital waveform that contains 1) the sum of the synthesized frequency and the frequencies represented by the A/D waveform samples, and 2) the difference between the synthesized frequency and the frequencies represented by the A/D waveform samples. The difference term at the output of the digital complex mixer 60 is therefore a frequency translated version of the A/D waveform. By adjusting the frequency of the synthesizer 58, the frequency of any signal contained in the input spectrum can be shifted down to a lower frequency or DC. Either a mix to DC or a mix to an offset frequency is acceptable, but mixing to an offset frequency is more desirable. This is because due to the 2's complement and the converter performance, a DC component will theoretically exist. Mixing to an offset frequency therefore avoids any interference with the DC component. Furthermore, mixing to an offset frequency enables the use of an adjustable bandpass filter that will naturally include the harmonics of the fundamental RF frequency(s).

The outputs of the complex mixer 60 are fed into a decimation module 66. The resulting shift to a frequency lower than the frequency contained in the voltage and the current signal spectrums requires less samples to satisfy the Nyquist criterion for the filtering stage that follows the decimation process. Thus, the decimation module 66 is coupled to the digital complex mixer 60, where the decimation module 66 reduces a data quantity of the digital power signal. Decimating the quantity of data reduces the processing overhead and provides the ability to enhance filter performance by incorporating a multi-rate filter. It is preferred that a cascaded integrator comb filter achieves the decimation.

It can further be seen that a low pass filter 68 is coupled to the decimation module 66 to shape the frequency response of the output of the decimation module 66. The low pass filter 68 band limits the digital power signal based on a fundamental frequency of the first plurality of frequencies. Thus, this stage includes a programmable filter whose purpose is to band limit the mixed down signal. The bandwidth of the filter is constrained to a range(s) of bandwidth of the RF fundamental frequency(s) used in the plasma chamber process. For example, if the chamber process uses a frequency tuning scheme over the range of $f_{low}$ to $f_{high}$, the low pass filter accommodates a bandwidth of $BW=f_{high}-f_{low}$. Thus, the bandwidth of the low pass filter 68 is selected to be at least BW in this embodiment.

When the bandwidth of the RF fundamental frequency becomes too large, the coefficients of the low pass filter 68 can be selected depending on the range of the input signal frequency. For example, if a chamber process uses a frequency tuning scheme over the range of $f'_{low}$ to $f'_{high}$, the low pass filter 68 accommodates a bandwidth of $BW'=f'_{high}-f'_{low}$. This bandwidth is considerably large and may impact the accuracy of the baseband scheme. In this case, the low pass filter 68 is designed with n sets of coefficients that generate n frequency responses that evenly distribute the pass band regions and overlaps in transition region of each of the neighboring filters over the BW'. When the tuning frequency moves out of the bandwidth response of the low pass filter 68, the filter 68 is programmed with a new set of coefficients. The frequency is tracked by the frequency output of the baseband scheme. Again, the above frequency tuning ranges and filter bandwidths are used for discussion purposes only.

A polyphase interpolation filter 70 is coupled to the low pass filter 68. The interpolation filter 70 generates an in phase (I) signal and a quadrature (Q) signal based on the digital power signal and a desired sampling rate. Thus, the interpolation filter 70 is used for symbol extraction and converts the sample rate of the data stream by a factor of K. The data is then resampled to a frequency of interest. This process can be thought of as an efficient implementation of a direct-form FIR structure. The implementation of the interpolation filter 70 has a fairly flat passband (although some ripple may exist) and a linear phase response. The linear phase response provides the translation necessary to derive the respective I and Q values.

It can further be seen that a Cartesian-to-polar converter 72 generates a digital magnitude signal and a digital phase signal based on the I and Q signals. The I and Q values are therefore converted from the Cartesian coordinates to polar coordinates. The resulting phase value is passed to a frequency discrimination module 74. The frequency discrimination module derives the frequency of the signal, and generates a digital spectrum signal based on the digital phase signal. The magnitude, phase and frequency are therefore derived for the RF fundamental signals as well as any number of harmonic tones. It has been determined that the first five harmonic tones typically contain most of the energy of interest. The preferred embodiment therefore involves the sampling of fundamental signals and the first five respective harmonic tones.

It will be appreciated that the components of the second baseband processor 56 are similar in function and purpose with regard to the digital current signal 26b. It is also important to note that the digital form of the digital processing unit 24' can be implemented in any combination of large scale integrated (LSI) and/or programmable digital signal processing (DSP) chip. Since there will be multiple channels of I and Q for each fundamental and respective harmonic tone, the LSI implementation is preferable in order to realize the speed advantages associated with parallel processing.

Digital Processing Unit (Broadband)

Figure 4:
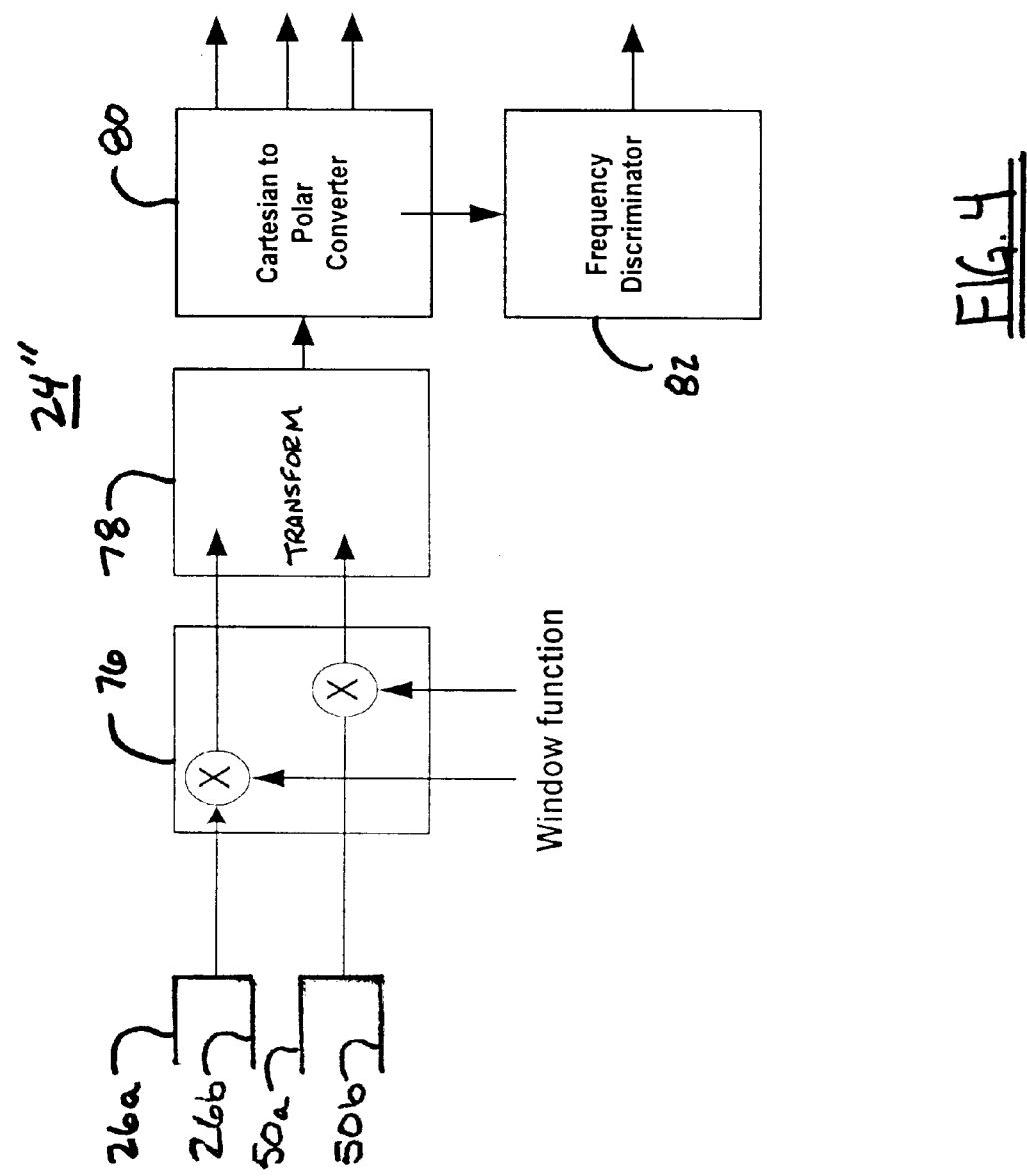
FIG. 4 is a block diagram showing a broadband digital processing unit in accordance with the principles of the present invention.

Turning now to FIG. 4, it can be seen that the digital processing unit may alternatively include a broadband processor 24" for simultaneously processing the digital power signals at the first plurality of frequencies and the second plurality of frequencies. Thus, the processing block diagram shown in FIG. 4 is repeated for each pair of converters 34,48 identified in FIG. 2. It should be noted that the present invention is not limited to any approach to translating a time domain sequence into frequency data. Thus, although the FFT described herein provides efficacy in deriving magnitude and phase for a plurality of frequencies, other transforms such as wavelet and Hartley can be used.

With continuing reference to FIG. 4, it can be seen that the first step in the processing block diagram is to apply a window function to the input data. Thus, a windowing module 76 applies a window function to the digital power signals. Window functions are well understood in the application of classical signal processing techniques. Some of the popular window functions are rectangle, Hamming, Blackman, Hanning, and minimum 4 term Blackman-Harris. The selection of a window function is primarily a trade-off between main lobe spreading and side lobe roll off. Although a minimum 4 term Blackman-Harris window function is described herein (for high processing gain) the selection of a window function is user configurable.

The result of the window function is passed on to the Fast Fourier Transform (FFT) module 78. The FFT module 78 calculates Discrete Fourier Transform (DFT) data based on the windowed digital power signals. The N-point FFT calculation provides a result that allows spectral analysis over a large bandwidth. A Cartesian-to-polar converter 80 generates digital magnitude signals and a digital phase signal based on the DFT data. Specifically, the magnitude and phase can be calculated for the energy of the respective bins for the RF fundamental(s) and associated harmonic tones. The N point calculation is also user configurable, but the design permits at least a 4096 point setting. The 4096 point is preferred for optimal processing gain.

It will be appreciated that frequency tracking is implemented in a frequency discriminator 82. Generally, the frequency discriminator 82 generates the digital spectrum signal based on the DFT data. It is preferred that the frequency discriminator 82 includes an interpolation filter.

Figure 5:
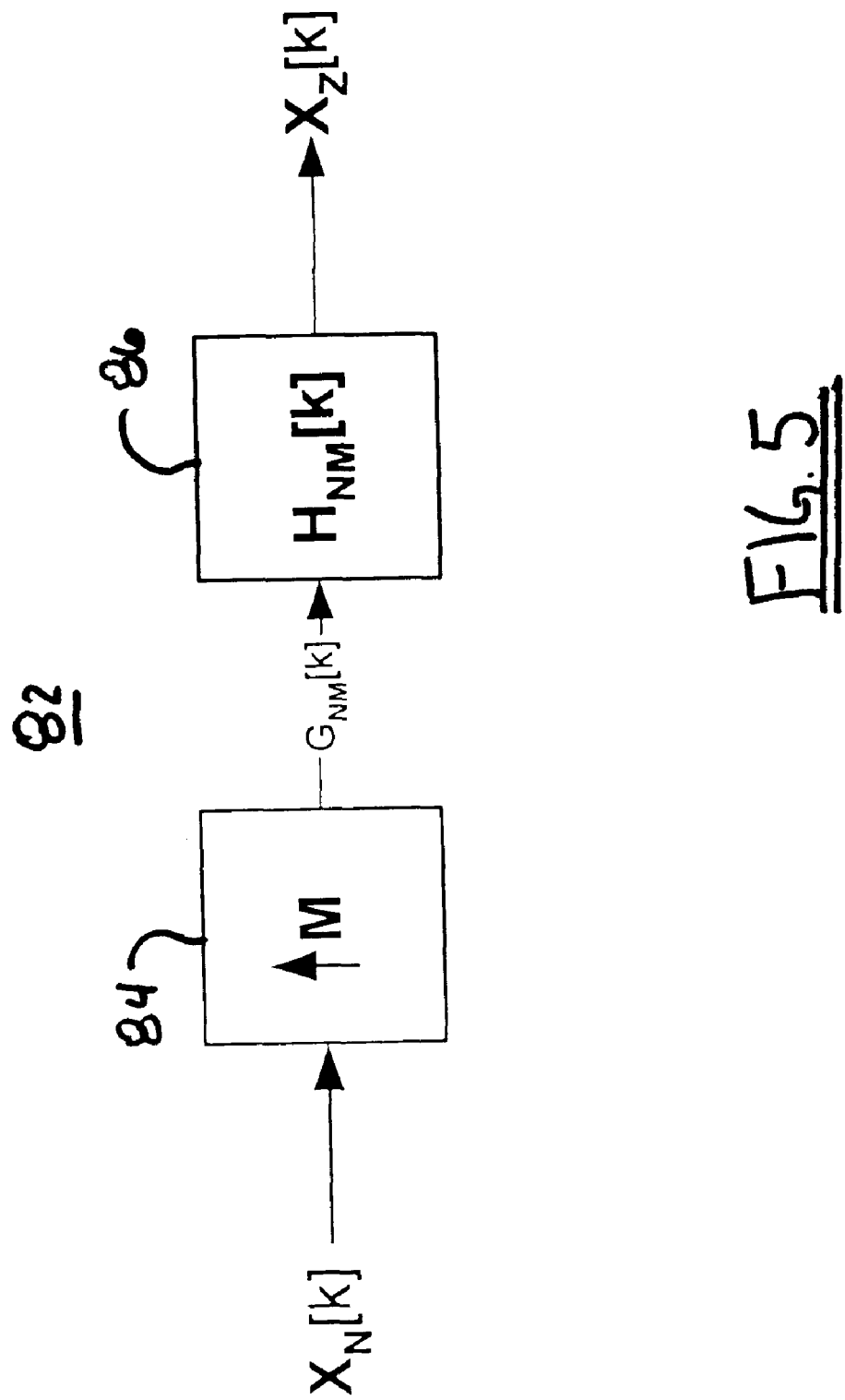
FIG. 5 is a block diagram showing a frequency discriminator in accordance with the present invention.
Figure 9:
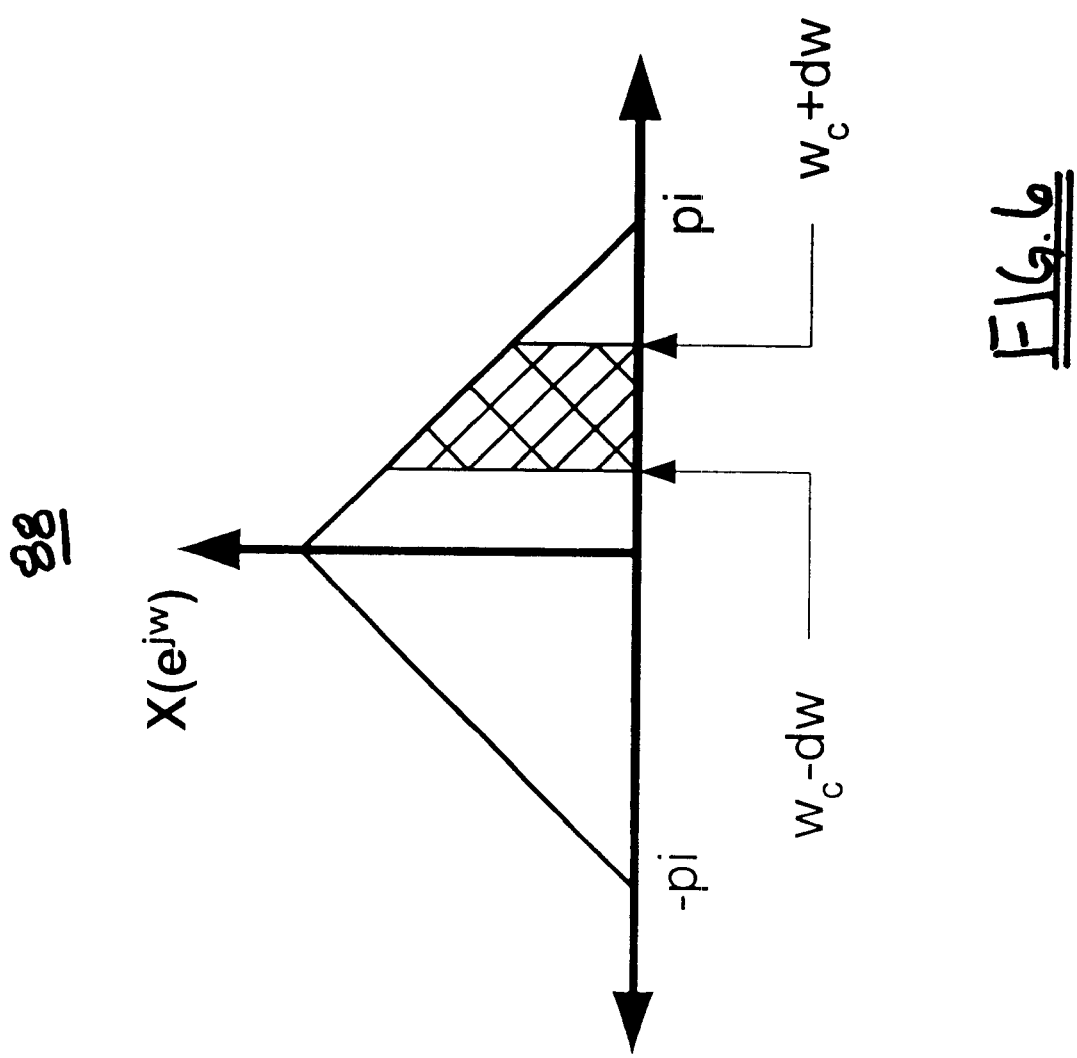
Figure 7:
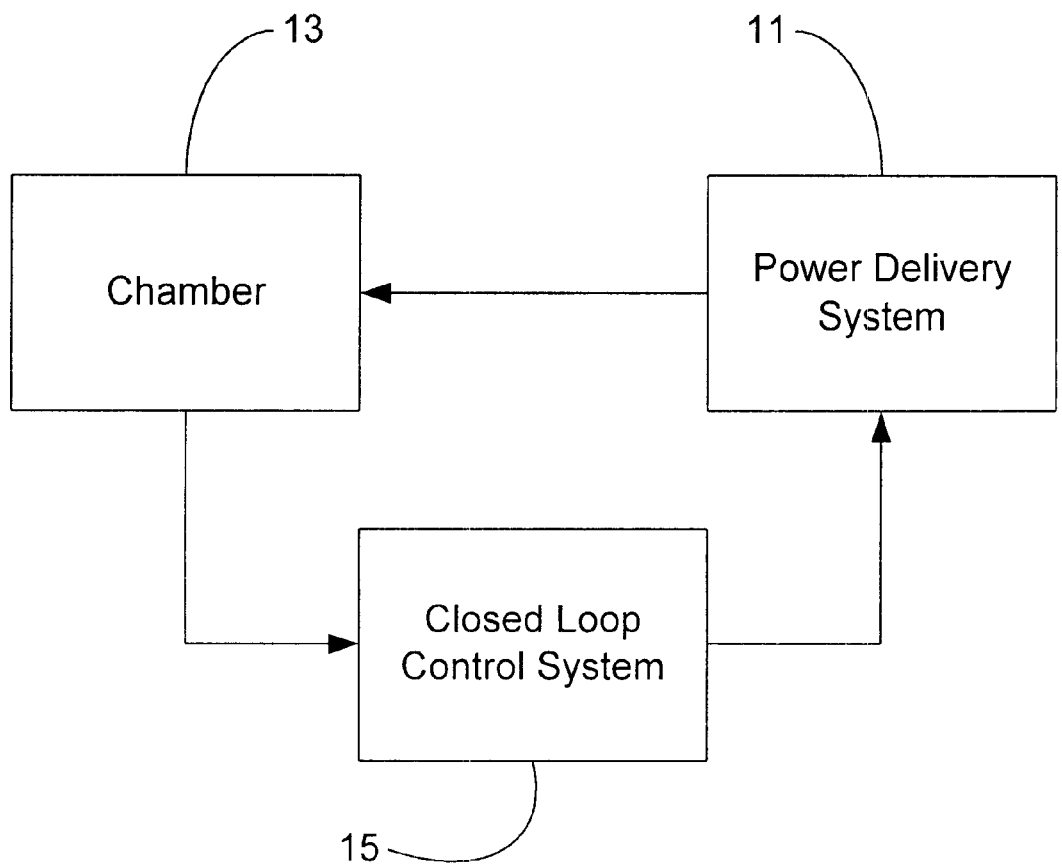
FIG. 7 is a block diagram showing a conventional power delivery configuration, useful in understanding the invention.

FIG. 5 illustrates the preferred frequency discriminator 82 in greater detail. It will be appreciated that $X_n[k]$ represents the resulting discrete Fourier transform coefficients produced by the FFT stage for the broadband processing approach. A frequency interpolator 84 up samples the DFT data by a factor of M. The up sampled result ($G_{NM}[K]$) is fed to a linear interpolator filter 86 to increase the spectral resolution of the digital spectrum signal.

Turning now to FIG. 6, it can be seen that the interpolator filter produces a fitting function 88 across the up sampled data point that resides between the discrete Fourier transform coefficients. This signal processing technique produces an equivalent N M-point DFT sequence. Applying this permits the system to track the RF fundamental frequencies to a more finite accuracy than the N-point DFT, without the additional processing overhead that the N M-point DFT would require. For example, given the spectral response of an input signal, suppose the goal is to determine a particular frequency, $w_c$ from an N-point DFT with an accuracy better than $f_s/N$. It will be appreciated that $f_s$ is the sampling rate and $f_s/N$ is the frequency resolution of the FFT calculation. The frequency discriminator permits an increase in the frequency resolution by applying the block diagram of FIG. 5 over the FFT coefficient range of $w_c-dw$ and $w_c+dw$.

Those skilled in the art can now appreciate from the foregoing description that the broad teachings of the present invention can be implemented in a variety of forms. Therefore, while this invention can be described in connection with particular examples thereof, the true scope of the invention should not be so limited since other modifications will become apparent to the skilled practitioner upon a study of the drawings, specification and following claims.

What is claimed is:

1. A radio frequency (RF) probe analysis system comprising:
   a sampling unit for generating digital power signals based on a plurality of analog signals, the analog signals characterizing power delivered from an RF power delivery system to a plasma chamber; and
   a digital-processing unit for generating a digital spectrum signal based on the digital power signals;
   said sampling unit simultaneously sampling a first plurality of frequencies from the analog signals such that the digital spectrum signal defines signal levels for the first plurality of frequencies and further simultaneously samples a second plurality of frequencies from the analog signals such that the digital spectrum signal further defines signal levels for the second plurality of frequencies.

2. The probe analysis system of claim 1 wherein the analog signals include an analog voltage signal and an analog current signal, the sampling unit including:
   a first filtering module for band limiting the analog voltage signal and the analog current signal to a first predetermined bandwidth, the first predetermined bandwidth including the first plurality of frequencies; and
   a primary A/D converter coupled to the filtering module, the primary A/D converter generating a first digital voltage signal based on the analog voltage signal and generating a first digital current signal based on the analog current signal, the first digital voltage signal and the first digital current signal defining the digital power signals;
   said primary A/D converter having a dual channel capability such that the first digital voltage signal and the first digital current signal are synchronized.

3. The probe analysis system of claim 2 wherein the filtering module includes:
   a first bandpass filter for band limiting the analog voltage signal; and
   a second bandpass filter for band limiting the analog current signal.

4. The probe analysis system of claim 2 further including a first memory device disposed between the primary A/D converter and the digital processing unit for temporarily storing the first digital voltage signal and the first digital current signal.

5. The probe analysis system of claim 1 wherein the sampling unit further includes:
   a second filtering module for band limiting the analog voltage signal and the analog current signal to a second predetermined bandwidth, the second predetermined bandwidth including the second plurality of frequencies; and
   a secondary A/D converter coupled to the second filtering module, the secondary A/D converter generating a second digital voltage signal based on the analog voltage signal and generating a second digital current signal based on the analog current signal, the second digital voltage signal and the second digital current signal further defining the digital power signals;
   said secondary A/D converter having a dual channel capability such that the second digital voltage signal and the second digital current signal are synchronized.

6. The probe analysis system of claim 5 further including a second memory device disposed between the secondary A/D converter and the digital processing unit for temporarily storing the second digital voltage signal and the second digital current signal.

7. The probe analysis system of claim 1 wherein the second plurality of frequencies includes a second fundamental frequency and a second plurality of harmonic frequencies corresponding to the second fundamental frequency.

8. The probe analysis system of claim 1 wherein the digital processing unit includes a broadband processor for simultaneously processing the digital power signals at the first plurality of frequencies and the second plurality of frequencies.

9. The probe analysis system of claim 8 wherein the broadband processor includes:
   a windowing module for applying a window function to the digital power signals;
   a Fast Fourier Transform (FFT) module for calculating Discrete Fourier Transform (DFT) data based on the windowed digital power signals;
   a Cartesian-to-polar converter for generating digital magnitude signals and a digital phase signal based on the DFT data; and
   a frequency discriminator for generating the digital spectrum signal based on the DFT data.

10. The probe analysis system of claim 9 wherein the frequency discriminator includes:
    a frequency interpolator for up sampling the DFT data; and
    a linear interpolator filter for increasing a spectral resolution of the digital spectrum signal based on the up sampled DFT data.

11. The probe analysis system of claim 1 further including a switching module for selectively adjusting an attenuation of the analog signals based on a signal level of the analog signals.

12. The probe analysis system of claim 11 further including a switch controller for selectively disabling the switching module based on a disable signal from the digital processing unit.

13. The probe analysis system of claim 1 wherein the digital power signals include a digital voltage signal and a digital current signal, the digital processing unit including:
   a first baseband processor for processing the digital voltage signal at the first plurality of frequencies; and
   a second baseband processor for processing the digital current signal at the first plurality of frequencies such that each baseband processor has a corresponding digital power signal.

14. The probe analysis system of claim 13 wherein each baseband processor includes:
   a digital frequency synthesizer for generating a digital mixing signal having a predetermined mixing frequency;
   a digital complex mixer adapted to receive the digital mixing signal and operable to combine the digital mixing signal with the corresponding digital power signal;
   a decimation module coupled to the digital complex mixer, the decimation module reducing a data quantity of the digital power signal;
   a low pass filter coupled to the decimation module, the low pass filter band limiting the digital power signal based on a fundamental frequency of the first plurality of frequencies;
   a polyphase interpolation filter coupled to the low pass filter, the interpolation filter generating an in phase signal and a quadrature signal based on the digital power signal and a desired sampling rate;
   a Cartesian-to-polar converter coupled to the interpolation filter, the Cartesian-to-polar converter generating a digital magnitude signal and a digital phase signal based on the in phase and quadrature signals; and
   a frequency discrimination module coupled to the Cartesian-to-polar converter, the frequency discrimination module generating the digital spectrum signal based on the digital phase signal.

15. The probe analysis system of claim 1 wherein the first plurality of frequencies includes a first fundamental frequency and a first plurality of harmonic frequencies corresponding to the first fundamental frequency.

16. A sampling unit for a radio frequency (RF) probe analysis system, the sampling unit comprising:
   a first filtering module for band limiting an analog voltage signal and an analog current signal to a first predetermined bandwidth, the analog voltage signal and the analog current signal having a first plurality of frequencies, the first predetermined bandwidth including the first plurality of frequencies;
   a primary N/D converter coupled to the filtering module, the primary A/D converter generating a first digital voltage signal based on the analog voltage signal and generating a first digital current signal based on the analog current signal; said primary A/D converter having a dual channel capability such that the first digital voltage signal and the first digital current signal are synchronized;
   a second filtering module for band limiting the analog voltage signal and the analog current signal to a second predetermined bandwidth, the analog voltage signal and the analog current signal having a second plurality of frequencies, the second predetermined bandwidth including the second plurality of frequencies; and
   a secondary A/D converter coupled to the second filtering module, the secondary A/D converter generating a second digital voltage signal based on the analog voltage signal and generating a second digital current signal based on the analog current signal; said secondary A/D converter having a dual channel capability such that the second digital voltage signal and the second digital current signal are synchronized.

17. The sampling unit of claim 16 wherein the first plurality of frequencies includes a first fundamental frequency and a first plurality of harmonic frequencies corresponding to the first fundamental frequency.

18. The sampling unit of claim 16 wherein the filtering module includes:
   a first bandpass filter for band limiting the analog voltage signal; and
   a second bandpass filter for band limiting the analog current signal.

19. The sampling unit of claim 16 further including a first memory device disposed between the primary A/D converter and a digital processing unit for temporarily storing the first digital voltage signal and the first digital current signal.

20. The sampling unit of claim 16 further including a second memory device disposed between the secondary A/D converter and a digital processing unit for temporarily storing the second digital voltage signal and the second digital current signal.

21. The sampling unit of claim 16 wherein the second plurality of frequencies includes a second fundamental frequency and a second plurality of harmonic frequencies corresponding to the second fundamental frequency.

22. A method for analyzing radio frequency (RF) power delivered to a plasma chamber, the method comprising the steps of:
   simultaneously sampling a first plurality of frequencies from a plurality of analog signals, the analog signals characterizing the RF power delivered to the chamber;
   generating digital power signals based on the analog signals;
   generating a digital mixing signal having a predetermined mixing frequency;
   combining the digital power signals with the digital mixing signal;
   down converting the digital power signals that the first plurality of frequencies are reduced in accordance with the predetermined mixing frequency;
   band limiting the digital power signals based on a fundamental frequency of the first plurality of frequencies;
   generating in phase signals and quadrature signals based on the digital power signals and a desired sampling rate;
   generating digital magnitude signals and digital phase signals based on the in phase and quadrature signals; and
   generating digital spectrum signals based on the digital phase signals; said digital spectrum signals defining signal levels for the first plurality of frequencies.

23. The method of claim 22 further including the step of simultaneously sampling a second plurality of frequencies from the analog signals such that the digital spectrum signals further define signal levels for the second plurality of frequencies.

24. A radio frequency (RF) probe analysis system comprising:

a sampling unit for generating digital power signals based on a plurality of analog signals, the analog signals characterizing power delivered from an RF power delivery system to a plasma chamber;

a switching module for selectively adjusting an attenuation of the analog signals based on a signal level of the analog signals; and a digital-processing unit for generating a digital spectrum signal based on the digital power signals; said sampling unit simultaneously sampling a first plurality of frequencies from the analog signals such that the digital spectrum signal defines signal levels for the first plurality of frequencies.

25. The probe analysis system of claim 24 further including a switch controller for selectively disabling the switching module based on a disable signal from the digital processing unit.

26. A radio frequency (RF) probe analysis system comprising:

a sampling unit for generating digital power signals based on a plurality of analog signals, the analog signals characterizing power delivered from an RF power delivery system to a plasma chamber; and a digital-processing unit for generating a digital spectrum signal based on the digital power signals where the digital power signals include a digital voltage signal and a digital current signal, said sampling unit simultaneously sampling a first plurality of frequencies from the analog signals such that the digital spectrum signal defines signal levels for the first plurality of frequencies, the digital processing unit further including:

a first baseband processor for processing the digital voltage signal at the first plurality of frequencies; and a second baseband processor for processing the digital current signal at the first plurality of frequencies such that each baseband processor has a corresponding digital power signal.

27. The probe analysis system of claim 13 wherein each baseband processor includes:

a digital frequency synthesizer for generating a digital mixing signal having a predetermined mixing frequency;

a digital complex mixer adapted to receive the digital mixing signal and operable to combine the digital mixing signal with the corresponding digital power signal;

a decimation module coupled to the digital complex mixer, the decimation module reducing a data quantity of the digital power signal;

a low pass filter coupled to the decimation module, the low pass filter band limiting the digital power signal based on a fundamental frequency of the first plurality of frequencies;

a polyphase interpolation filter coupled to the low pass filter, the interpolation filter generating an in phase signal and a quadrature signal based on the digital power signal and a desired sampling rate;

a Cartesian-to-polar converter coupled to the interpolation filter, the Cartesian-to-polar converter generating a digital magnitude signal and a digital phase signal based on the in phase and quadrature signals; and a frequency discrimination module coupled to the Cartesian-to-polar converter, the frequency discrimination module generating the digital spectrum signal based on the digital phase signal.

* * * * *

UNITED STATES PATENT AND TRADEMARK OFFICE
CERTIFICATE OF CORRECTION

PATENT NO. : 6,522,121 B2
DATED : February 18, 2003
INVENTOR(S) : David J. Coumou It is certified that error appears in the above-identified patent and that said Letters Patent is hereby corrected as shown below:

Column 3,
Line 53, "the-principles" should be -- the principles --.

Column 5,
Line 55, "of-frequencies" should be -- of frequencies --.

Column 11,
Line 56, "N/D" should be -- A/D --.

Signed and Sealed this

First Day of June, 2004

JON W. DUDAS
*Acting Director of the United States Patent and Trademark Office*